US010172233B2

(12) United States Patent
Chung et al.

(10) Patent No.: US 10,172,233 B2
(45) Date of Patent: Jan. 1, 2019

(54) DISPLAY DEVICE AND MANUFACTURING METHOD THEREOF

(71) Applicant: Samsung Display Co., Ltd., Yongin-si (KR)

(72) Inventors: Kyung Hoon Chung, Yongin-si (KR); Chul Kyu Kang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/644,471

(22) Filed: Jul. 7, 2017

(65) Prior Publication Data
US 2018/0014399 A1 Jan. 11, 2018

(30) Foreign Application Priority Data
Jul. 8, 2016 (KR) .................. 10-2016-0086945

(51) Int. Cl.
H05K 1/02 (2006.01)
H05K 3/30 (2006.01)
H05K 5/00 (2006.01)
G09F 9/30 (2006.01)
G02F 1/13 (2006.01)

(52) U.S. Cl.
CPC ............. H05K 1/028 (2013.01); G02F 1/13 (2013.01); H05K 3/30 (2013.01); H05K 5/0017 (2013.01); G09F 9/301 (2013.01); H05K 2201/10106 (2013.01); H05K 2201/10136 (2013.01)

(58) Field of Classification Search
CPC ....... H05K 1/028; H05K 5/0017; G09F 9/301
See application file for complete search history.

(56) References Cited

U.S. PATENT DOCUMENTS 6,750,926 B2 * 6/2004 Ohgiichi ............... G02F 1/1345
324/760.01
8,593,061 B2 * 11/2013 Yamada ............. H01L 27/3293
313/503
9,214,640 B2 * 12/2015 Lee ..................... H01L 51/0097
9,560,751 B2 * 1/2017 Huitema ................ H05K 1/028
9,647,043 B2 * 5/2017 Hirakata ............... G06F 3/1446

FOREIGN PATENT DOCUMENTS

KR   1020110064287   6/2011
KR      101108172    1/2012
KR   1020150062237   6/2015
KR   1020150124543   11/2015

* cited by examiner

Primary Examiner — William H Mayo, III
Assistant Examiner — Hiram E Gonzalez
(74) Attorney, Agent, or Firm — Cantor Colburn LLP

(57) ABSTRACT

A display device includes: a flexible substrate including a display unit and a plurality of peripheral units which surrounds the display unit and are bent to overlap a part of the display unit; a display member positioned at the display unit and which displays an image; and a signal line positioned at the plurality of peripheral units, where the plurality of peripheral units is bent in a way such that parts of the signal line, which are respectively positioned at adjacent peripheral units, are in contact with each other.

12 Claims, 18 Drawing Sheets

DISPLAY DEVICE AND MANUFACTURING METHOD THEREOF

This application claims priority to Korean Patent Application No. 10-2016-0086945, filed on Jul. 8, 2016, and all the benefits accruing therefrom under 35 U.S.C. § 119, the content of which in its entirety is herein incorporated by reference.

BACKGROUND

1. Field

The disclosure relates to a display device and a manufacturing method thereof.

2. Description of the Related Art

In general, a liquid crystal display ("LCD"), an organic light emitting diode ("OLED") display, etc., are widely used as a display device.

Such a display device typically includes a display area for displaying an image and a bezel area defined by a peripheral of the display area. In such a display device, a circuit for driving a plurality of pixels in the display area, a wire, and a portion for bonding with an external integrated chip are typically provided in the bezel area thereof. Many attempts and research have been done to minimize the bezel area and to maximize the display area.

SUMMARY

Exemplary embodiments relate to a display device having a slim bezel and a manufacturing method thereof.

An exemplary embodiment of a display device includes: a flexible substrate including a display unit and a plurality of peripheral units which surrounds the display unit and are bent to overlap a part of the display unit; a display member positioned at the display unit and which displays an image; and a signal line positioned at the plurality of peripheral units, where the plurality of peripheral units is bent in a way such that parts of the signal line, which are respectively positioned at adjacent peripheral units, are in contact with each other.

In an exemplary embodiment, the plurality of peripheral units may include a first peripheral unit, a second peripheral unit opposite to the first peripheral unit, and a third peripheral unit positioned between the first peripheral unit and the second peripheral unit, and one end part of the first peripheral unit and one end part of the third peripheral unit may overlap each other.

In an exemplary embodiment, the third peripheral unit may include the one end part, the other end part spaced apart from the one end part, and a third main peripheral unit positioned between the one end part and the other end part. In such an embodiment, the one end part of the third peripheral unit may be bent from the third main peripheral unit to overlap the one end part of the first peripheral unit. In such an embodiment, the plurality of signal lines may include a first signal line positioned at the one end part of the first peripheral unit, a second signal line positioned at one end part of the second peripheral unit, and a third one side signal line positioned at the one end part of the third peripheral unit, and the first signal line may be in contact with the third one side signal line.

In an exemplary embodiment, the one end part of the second peripheral unit and the other end part of the third peripheral unit may overlap each other.

In an exemplary embodiment, the other end part of the third peripheral unit may be bent from the third main peripheral unit to overlap the one end part of the second peripheral unit, the plurality of signal lines may further include a third other side signal line positioned at the other end part of the third peripheral unit, and the second signal line may be in contact with the third other side signal line.

In an exemplary embodiment, each of the one end part of the first peripheral unit, the one end part of the second peripheral unit, and the one end part and the other end part of the third peripheral unit may have a trapezoidal shape.

In an exemplary embodiment, each of the one end part of the first peripheral unit, the one end part of the second peripheral unit, and the one end part and the other end part of the third peripheral unit may have a triangular shape.

In an exemplary embodiment, the plurality of peripheral units may further include a fourth peripheral unit opposite to the third peripheral unit, and the first peripheral unit and the fourth peripheral unit may not overlap each other.

In an exemplary embodiment, the plurality of peripheral units may further include a fourth peripheral unit facing the third peripheral unit, the other end part of the first peripheral unit and one end part of the fourth peripheral unit may overlap each other, and the other end part of the second peripheral unit and the other end part of the fourth peripheral unit may overlap each other.

In an exemplary embodiment, the fourth peripheral unit may include the one end part, the other end part spaced apart from the one end part and a fourth main peripheral unit positioned between the one end part and the other end part. In such an embodiment, the other end part of the fourth peripheral unit may be bent from the fourth main peripheral unit to overlap the other end part of the first peripheral unit, and the plurality of signal lines may include a first other side signal line positioned at the other end part of the first peripheral unit, a second other side signal line positioned at the other end part of the second peripheral unit, a fourth one side signal line positioned at the one end part of the fourth peripheral unit, and a fourth other side signal line positioned at the other end part of the fourth peripheral unit. In such an embodiment, the first other side signal line may be in contact with the fourth one side signal line, and the second other side signal line may be in contact with the fourth other side signal line.

In an exemplary embodiment, each of one end part and the other end part of the first peripheral unit, each of one end part and the other end part of the second peripheral unit, each of one end part and the other end part of the third peripheral unit, and each of one end part and the other end part of the fourth peripheral unit may have the trapezoidal shape.

In an exemplary embodiment, each of the one end part and the other end part of the first peripheral unit, each of the one end part and the other end part of the second peripheral unit, each of the one end part and the other end part of the third peripheral unit, and each of the one end part and the other end part of the fourth peripheral unit may have the triangular shape.

In an exemplary embodiment, a manufacturing method of a display device includes: manufacturing a flexible substrate including a display unit and a plurality of peripheral units surrounding the display unit; providing a display member, which displays an image, on the display unit of the flexible substrate and providing a plurality of signal lines on the plurality of peripheral units; and bending the plurality of peripheral units to allow the plurality of signal lines to contact with each other.

In an exemplary embodiment, the plurality of peripheral units may include a first peripheral unit, a second peripheral unit opposite to the first peripheral unit, and a third peripheral unit positioned between the first peripheral unit and the second peripheral unit, and the plurality of signal lines may include a first signal line positioned at one end part of the first peripheral unit and a second signal line positioned at one end part of the third peripheral unit. In such an embodiment, the bending the plurality of peripheral units may include bending the first peripheral unit and the second peripheral unit, bending the one end part of the third peripheral unit and the other end part of the third peripheral unit, and bending the third peripheral unit to overlap the one end part of the first peripheral unit and the one end part of the third peripheral unit with each other in a way such that the first signal line and the second signal line are in contact with each other.

In an exemplary embodiment, the plurality of signal lines may further include a third signal line positioned at one end part of the second peripheral unit and a fourth signal line positioned at the other end part of the third peripheral unit, and the bending the plurality of peripheral units may further include bending the third peripheral unit to overlap the one end part of the second peripheral unit and the other end part of the third peripheral unit with each other in a way such that the third signal line and the fourth signal line are in contact with each other.

According to an exemplary embodiment, a bezel area to transmit a driving signal of a driving circuit unit is omitted or folded to be disposed below a display unit, such that the size or area of the display unit may be maximized.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
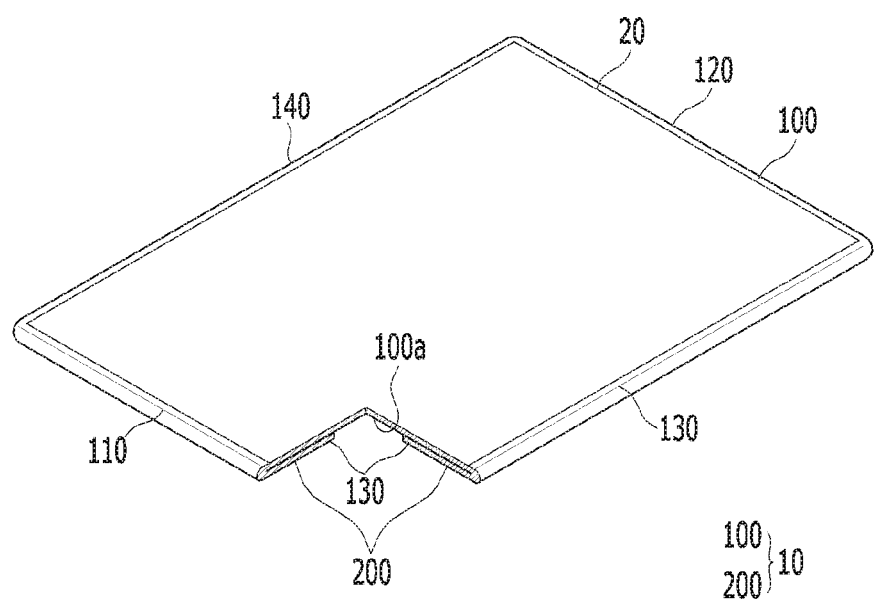
FIG. 1 is a schematic partial cutaway perspective view of a display device according to an exemplary embodiment.

The invention will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device according to the invention will be described in detail with reference to accompanying drawings.

Figure 2:
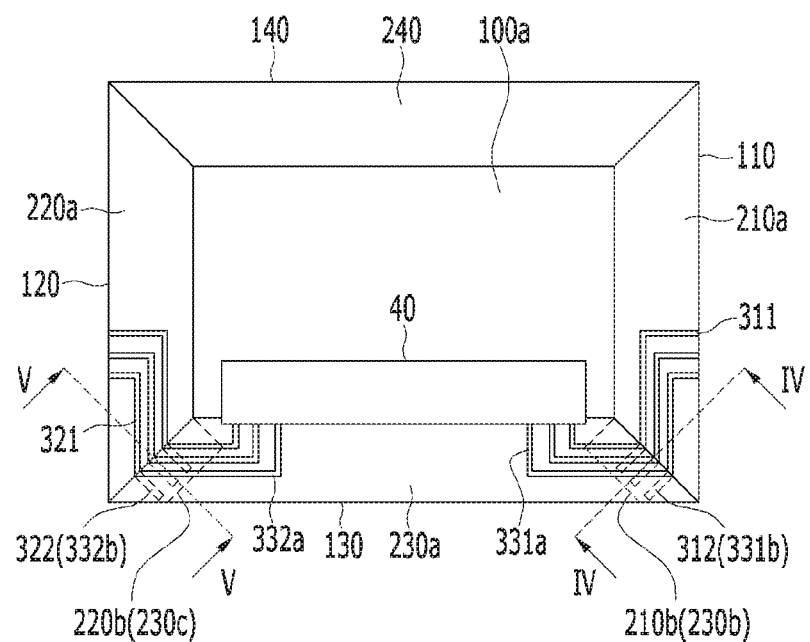
FIG. 2 is a rear view of the display device of FIG. 1.
Figure 3:
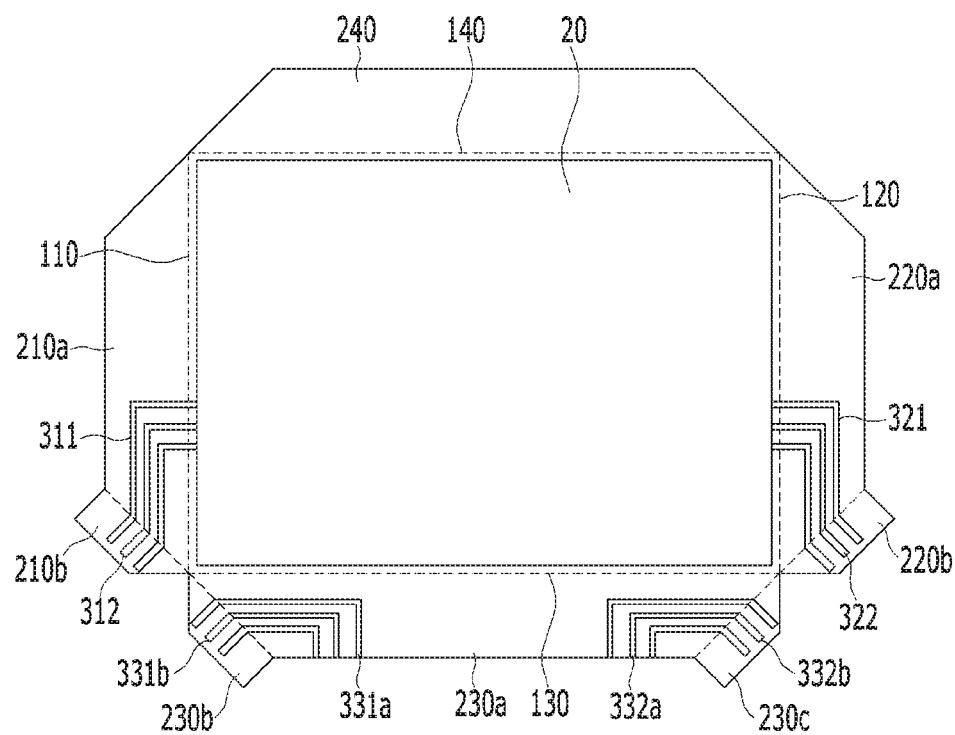
FIG. 3 is a top plan view showing the display device of FIG. 1 in a state in which a plurality of peripheral units is unbent.

FIG. 1 is a schematic partial cutaway perspective view of a display device according to an exemplary embodiment, FIG. 2 is a rear view of the display device of FIG. 1, and FIG. 3 is a top plan view showing the display device of FIG. 1 in a state in which a plurality of peripheral units is unbent.

As shown in FIGS. 1 and 2, an exemplary embodiment of a display device includes a flexible substrate 10 including a display unit 100 and a plurality of peripheral units 200 surrounding the display unit 100, and further includes a display member 20 disposed in the display unit 100 and which displays an image, and a plurality of signal lines 30 respectively disposed in the plurality of peripheral units 200.

The display unit 100 of the flexible substrate 10 has a square shape when viewed from a plan view, and the plurality of peripheral units 200 of the flexible substrate 10 are bent or folded at four sides of the display unit 100 to contact (or to be in direct contact with) a rear surface 100a of the display unit 100. Accordingly, the plurality of peripheral units 200 overlaps a part of the display unit 100 when viewed from a plan view. For convenience of illustration and description, FIG. 1 shows an embodiment of the display device in which a corner of the flexible substrate 10 is cutaway to show the peripheral units 200 bend for folded to be disposed below the display unit 100.

The four sides of the display unit 100 includes a first side 110 and a second side 120 facing each other, and further includes a third side 130 and a fourth side 140 positioned between the first side and the second side, respectively, and facing each other.

In an exemplary embodiment, as shown in FIGS. 2 and 3, the plurality of peripheral units 200 include a first peripheral unit 210 adjacent or connected to the first side 110 of the display unit 100, a second peripheral unit 220 adjacent or connected to the second side 120, a third peripheral unit 230 adjacent or connected to the third side 130, and a fourth peripheral unit 240 adjacent or connected to the fourth side 140. In such an embodiment, as shown in FIG. 3, the first peripheral unit 210 includes a first main peripheral unit 210a and a first one end part 210b extending from one side end of the first main peripheral unit 210a, the second peripheral unit 220 includes a second main peripheral unit 220a and a second one end part 220b extending from one side end of the second main peripheral unit 220a, and the third peripheral unit 230 includes a third main peripheral unit 230a, a third one end part 230b extending from one side end of the third main peripheral unit 230a, and a third other end part 230c extending from the other side end of the third main peripheral unit 230a. Herein, among ends (i.e., side lines or edge lines) of each of the third to third main peripheral unit 210a, 220a and 230a, an end connected to a corresponding side of the display unit 100 is defined as a lower end, an end opposite to and parallel with the lower end is defined as an upper end, and ends connected between the lower and upper ends are defined as one side end and the other side end, respectively.

Each of the first main peripheral unit 210a, the second main peripheral unit 220a, the third main peripheral unit 230a and the fourth peripheral unit 240 has a trapezoidal shape in which both side lines are inclined, and each of the first one end part 210b, the second one end part 220b, the third one end part 230b and the third other end part 230c has a trapezoidal shape, in which only one side line is inclined and the other side line is vertical with respect to the lower and upper side lines, which are parallel to each other.

In such an embodiment, as shown in FIGS. 2 and 3, parts of the first peripheral unit 210 and the third peripheral unit 230 overlap each other in a bent state, and parts of the second peripheral unit 220 and the third peripheral unit 230 overlap each other in the bent state. Such an overlapping structure will be described in detail with reference to accompanying drawings.

In such an embodiment, as shown in FIGS. 2 and 3, the first peripheral unit 210 and the fourth peripheral unit 240 do not overlap each other but are in contact with each other. The second peripheral unit 220 and the fourth peripheral unit 240 do not overlap each other and are in contact with each other. In the specification, "overlapping" means that there is a portion overlapping at least partly in a thickness direction of the flexible substrate 10 or when viewed from a plan view in the thickness direction of the flexible substrate 10.

The display member 20 may be a flat display panel such as an organic light emitting panel or a liquid crystal panel, for example.

The plurality of signal lines 30 transmits the driving signal transmitted from an external driving circuit unit 40 to the display member 20 to drive the display member 20. The plurality of signal lines 30 include a first signal line 31 positioned in the first peripheral unit 210, a second signal line 32 positioned in the second peripheral unit 220, and a third signal line 33 positioned in the third peripheral unit 230.

In an exemplary embodiment, as shown in FIG. 3, the first signal line 31 includes a first center line 311 positioned in the first main peripheral unit 210a, and a first connection line 312 connected to the first center line 311 and positioned in the first one end part 210b. The first center line 311 may be connected to the display member 20.

In such an embodiment, the second signal line 32 includes a second center line 321 positioned in the second main peripheral unit 220a, and a second connection line 322 connected to the second center line 321 and positioned in the second one end part 220b. The second center line 321 is connected to the display member 20.

In such an embodiment, the third signal line 33 includes a third one side signal line 331 and a third other side signal line 332 that are spaced apart from each other.

The third one side signal line 331 includes a third one side center line 331a positioned in the third main peripheral unit 230a, and a third one side connection line 331b connected to the third one side center line 331a and positioned in the third one end part 230b. In an exemplary embodiment, as shown in FIG. 2, the third one side center line 331a is connected to the driving circuit unit 40 such that the driving signal generated from the driving circuit unit 40 is transmitted to the third one side connection line 331b.

The third other side signal line 332 includes a third other side center line 332a positioned in the third main peripheral unit 230a, and a third other side connection line 332b connected to the third other side center line 332a and positioned in the third other end part 230c. The third other side center line 332a is connected to the driving circuit unit 40 such that the driving signal generated from the driving circuit unit 40 is transmitted to the third other side connection line 332b.

In an exemplary embodiment, the first center line 311 and the second center line 321 are directly connected to the display member 20 such that the driving signal generated from the driving circuit unit 40 may include all of a data driving signal, a scan driving signal, a power source signal, etc. However, embodiments are not limited thereto. Alternatively, the first center line 311 and the second center line 321 may be connected to a separate embedded scan circuit unit or a separate external scan circuit chip. However, in such an embodiment, separate wiring from the separate embedded scan circuit portion or the external scan circuit chip to the display member 20 may be used, and the scan driving signal is generated from the separate embedded scan circuit unit or the external scan circuit chip.

Next, the structure of an exemplary embodiment of the display device will be described in detail with reference to FIGS. 4 to 6.

Figure 4:
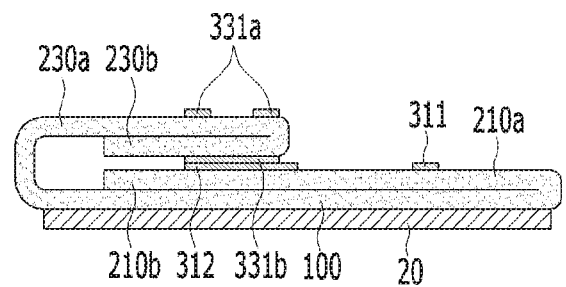
FIG. 4 is a cross-sectional view taken along line IV-IV of FIG. 2.
Figure 5:
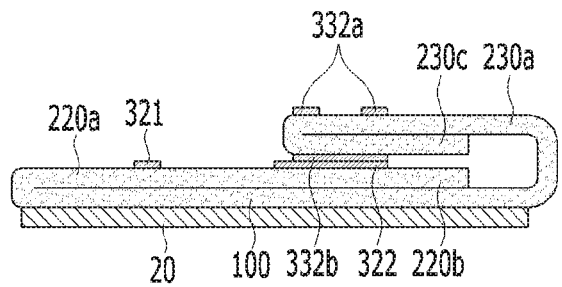
FIG. 5 is a cross-sectional view taken along line V-V of FIG. 2.
Figure 6:
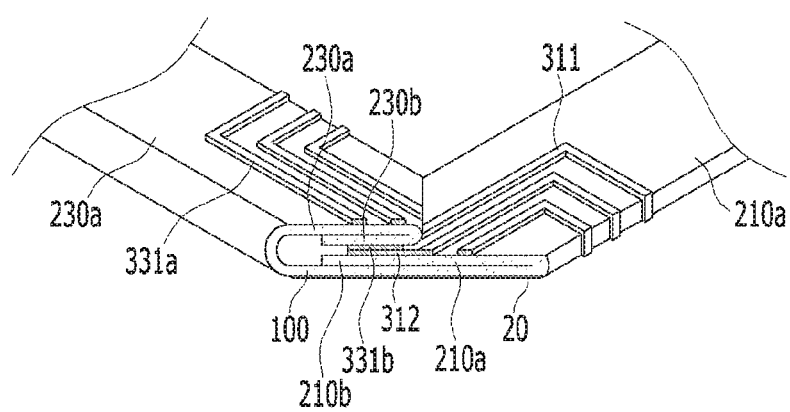
FIG. 6 is an enlarged cutaway perspective view of a portion of the display device of FIG. 1.

FIG. 4 is a cross-sectional view taken along line IV-IV of FIG. 2, FIG. 5 is a cross-sectional view taken along line V-V of FIG. 2, and FIG. 6 is an enlarged cutaway perspective view of a portion of the display device of FIG. 1.

As shown in FIGS. 4 and 6, the third one end part 230b is bent or folded to overlap the first one end part 210b. Accordingly, the first connection line 312 positioned in the first one end part 210b is in contact with the third one side connection line 331b positioned in the third one end part 230b to be connected thereto. Accordingly, the driving signal generated from the driving circuit unit 40 is transmitted to the first connection line 312, the first center line 311 and the display member 20 sequentially through the third one side center line 331a and the third one side connection line 331b.

In such an embodiment, as described above, the first signal line 31 and the third signal line 33 respectively positioned in the bent first peripheral unit 210 and third peripheral unit 230 are in contact with each other to transmit the driving signal, a separate bezel area to be provided to accommodate signal lines may be removed, thereby maximizing the size or area of the display unit 100.

In an exemplary embodiment, as shown in FIGS. 4 and 6, the third one end part 230b is bent, but not being limited thereto. In an alternative exemplary embodiment, the first one end part 210b may be bent.

In an exemplary embodiment, as shown in FIG. 5, the third other end part 230c is bent to overlap the second one end part 220b. Accordingly, the second connection line 322 positioned in the second one end part 220b is in contact with the third other side connection line 332b of the third other end part 230c to be connected with each other. Accordingly, the driving signal generated from the driving circuit unit 40 (shown in FIG. 2) is transmitted to the second connection line 322, the second center line 321 and the display member 20 sequentially through the third other side center line 332a and the third other side connection line 332b.

In an exemplary embodiment, as described above, the second signal line 32 and the third signal line 33, which are positioned in the bent second peripheral unit 220 and third peripheral unit 230, respectively, are in contact with each other to transmit the driving signal, such that the display unit 100 may be maximized or the size of the display unit 100 may be effectively increased.

In an exemplary embodiment, as shown in FIG. 5, the third other end part 230c is bent, but not being limited thereto. In an alternative exemplary embodiment, the second one end part 220b may be bent.

Hereinafter, an exemplary embodiment of a manufacturing method of the display device according to the invention will now be described in detail with reference to accompanying drawings.

Figure 7:
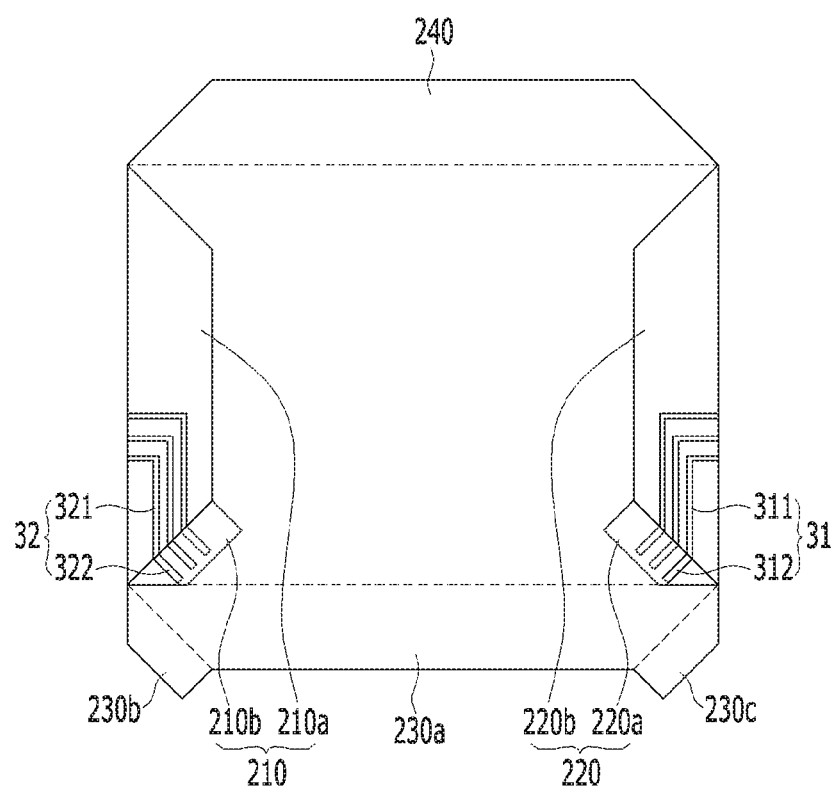
FIGS. 7 to 9 are plan views showing a manufacturing method of a display device according to an exemplary embodiment.
Figure 8:
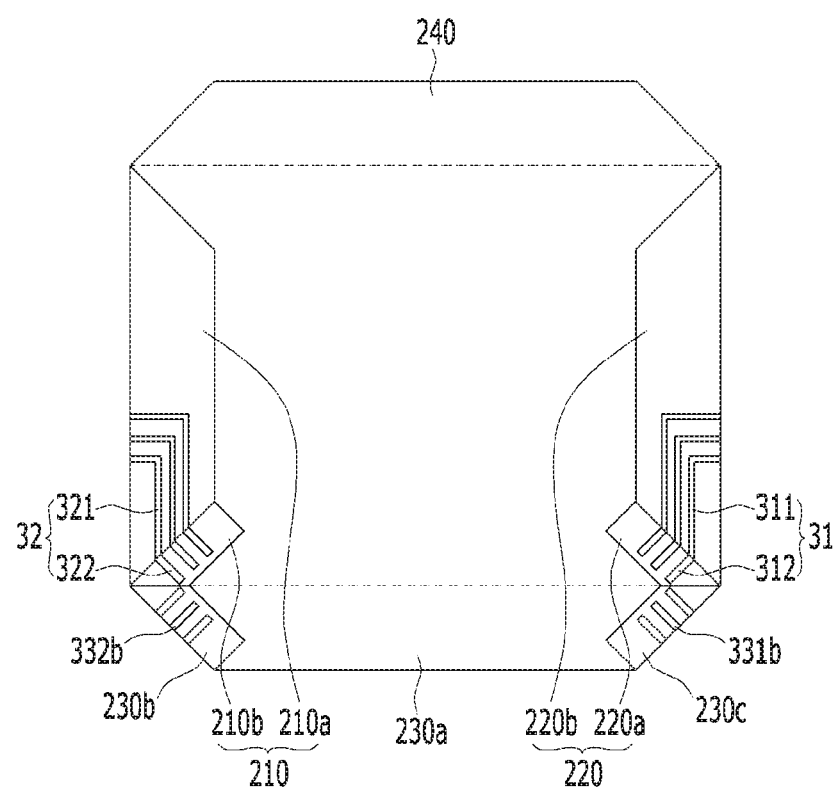
Figure 9:
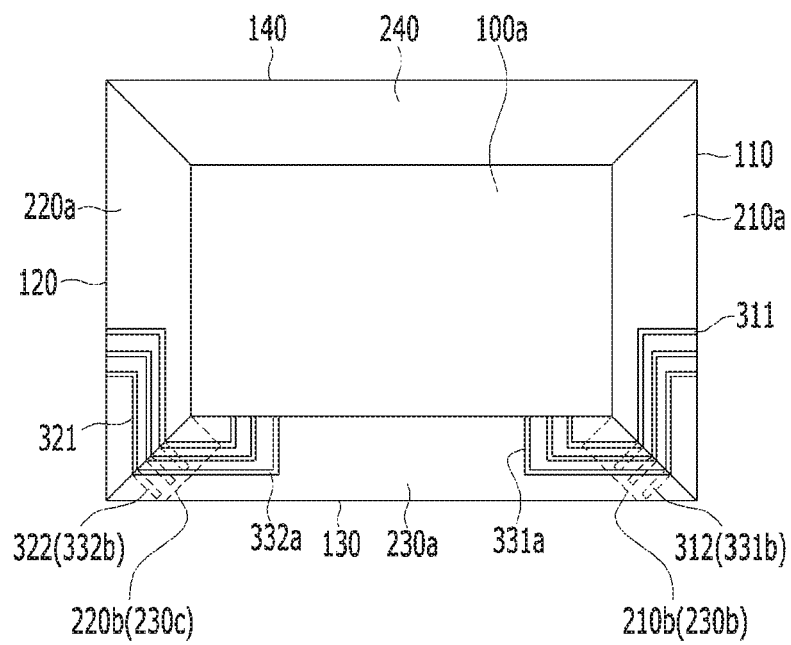

FIGS. 7 to 9 are plan views showing a manufacturing method of a display device according to an exemplary embodiment.

In an exemplary embodiment of the manufacturing method, as shown in FIGS. 1 and 3, a flexible substrate 10 including a display unit 100 and a plurality of peripheral units 200 surrounding the display unit 100 are prepared or manufactured. The plurality of peripheral units 200 includes a first peripheral unit 210, a second peripheral unit 220, a third peripheral unit 230, and a fourth peripheral unit 240.

In such an embodiment, a display member 20 for displaying the image is provided or formed on the display unit 100 of the flexible substrate 10, and a plurality of signal lines 30 are respectively provided or formed on the plurality of peripheral units 200. The plurality of signal lines 30 include a first signal line 31 positioned at the first peripheral unit 210, a second signal line 32 positioned at the second peripheral unit 220, and a third signal line 33 positioned at the third peripheral unit 230.

In such an embodiment, as shown in FIG. 7, the first peripheral unit 210 and the second peripheral unit 220 as a part of the flexible substrate have flexibility, and the first peripheral unit 210 and the second peripheral unit 220 may be bent or folded. In such an embodiment, the first peripheral unit 210 and the second peripheral unit 220 are bent to be in contact with a rear surface 100a of the display unit 100. Accordingly, the first peripheral unit 210 and the second peripheral unit 220 overlap at least a part of the display unit 100 when viewed from a plan view.

In such an embodiment, as shown in FIG. 8, the third one end part 230b and the third other end part 230c are bent to be in contact with the third main peripheral unit 230a. Accordingly, the third one end part 230b and the third other end part 230c overlap the third main peripheral unit 230a.

In such an embodiment, as shown in FIG. 9, the third main peripheral unit 230a is bent to overlap the third one end part 230b with the first one end part 210b and to overlap the third other end part 230c with the second one end part 220b.

Accordingly, as shown in FIG. 9, the first connection line 312 positioned at the first one end part 210b is in contact with the third one side connection line 331b positioned at the third one end part 230b, and the second connection line 322 positioned at the second one end part 220b is in contact with the third other side connection line 332b positioned at the third other end part 230c.

In such an embodiment, as described above, as the first peripheral unit 210 including the first one end part 210b and the second peripheral unit 220 including the second one end part 220b are bent and the third peripheral unit 230 including the third one end part 230b and the third other end part 230c is bent, the third signal line 33 connected to the driving circuit unit 40 (shown in FIG. 2) may be connected to the first signal line 31 and the second signal line 32 connected to the display member 20 to each other on the rear surface 100a of the display unit 100. Accordingly, the size of the display unit 100 may be maximized by omitting a separate bezel area to transmit the driving signal of the driving circuit unit 40.

In such an embodiment, the fourth peripheral unit 240 is bent to be in contact with the rear surface 100a of the display unit 100. In such an embodiment, as shown in FIG. 2, the driving circuit unit 40 is connected to the third one side center line 331a and the third other side center line 332a.

In such an embodiment, the signal line is not separately positioned in the fourth peripheral unit. In an alternative exemplary embodiment, the signal may be separately positioned in the fourth peripheral unit.

Next, alternative exemplary embodiments of the display device will be described in detail with reference to FIGS. 10 and 11.

Figure 10:
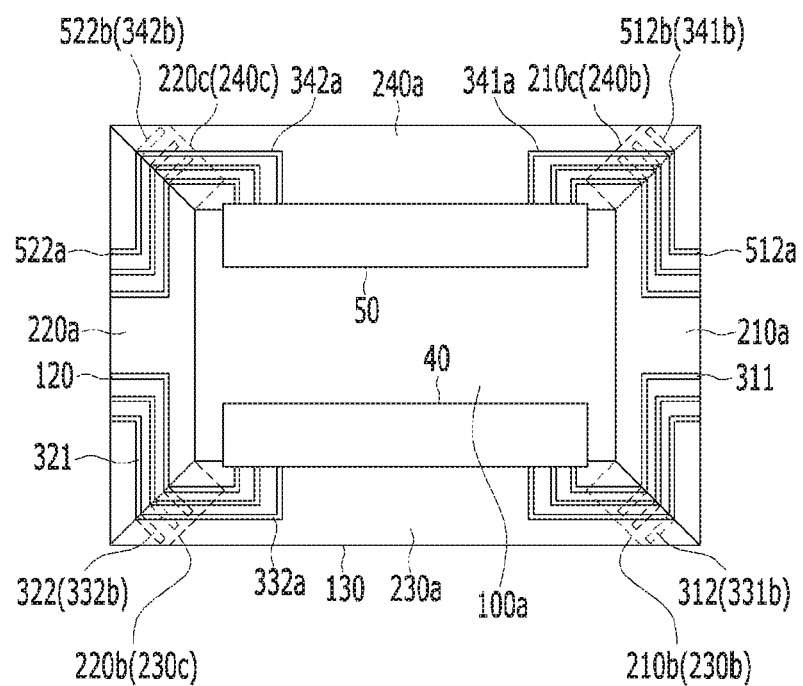
FIG. 10 is a rear view of a display device according to an alternative exemplary embodiment.
Figure 11:
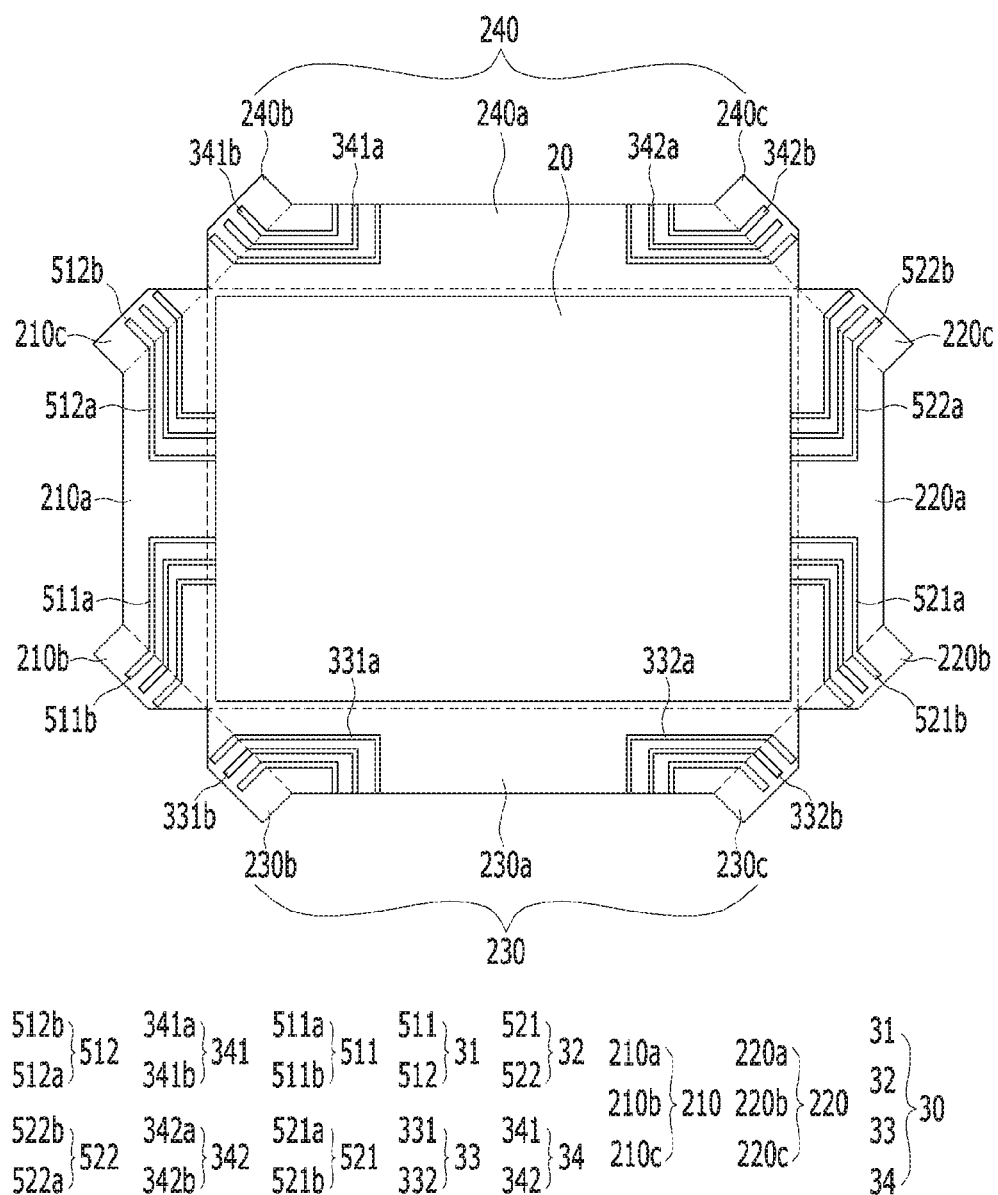
FIG. 11 is a top plan view showing the display device of FIG. 10 in a state in which a plurality of peripheral units is unbent.

FIG. 10 is a rear view of a display device according to an alternative exemplary embodiment, and FIG. 11 is a top plan view showing the display device of FIG. 10 in a state in which a plurality of peripheral units is unbent.

The exemplary embodiment shown in FIGS. 10 and 11 is substantially the same as the exemplary embodiment shown in FIGS. 1 to 6 except for the structure of the fourth peripheral unit. Accordingly, any repetitive detailed description of the same or like elements will hereinafter be omitted or simplified.

In an exemplary embodiment, as shown in FIGS. 10 and 11, the first peripheral unit 210 of the display device includes a first main peripheral unit 210a, a first one end part 210b extending from one side end of the first main peripheral unit 210a, and a first other end part 210c extending from the other side end of the first main peripheral unit 210a. In such an embodiment, the second peripheral unit 220 includes a second main peripheral unit 220a, a second one end part 220b extending from one side end of the second main peripheral unit 220a, and a second other end part 220c extending from the other side end of the second main peripheral unit 220a. The third peripheral unit 230 includes a third main peripheral unit 230a, a third one end part 230b extending from one side end of the third main peripheral unit 230a, and a third other end part 230c extending from the other side end of the third main peripheral unit 230a. The fourth peripheral unit 240 includes a fourth main peripheral unit 240a, a fourth one end part 240b extending from one side end of the fourth main peripheral unit 240a, and a fourth other end part 240c extending from the other side end of the fourth main peripheral unit 240a.

Each of the first main peripheral unit 210a, the second main peripheral unit 220a, the third main peripheral unit 230a, and the fourth main peripheral unit 240a may have a trapezoidal shape in which both side lines are inclined, and each of the first one end part 210b, the first other end part 210c, the second one end part 220b, the second other end part 220c, the third one end part 230b, the third other end part 230c, the fourth one end part 240b, and the fourth other end part 240c may have a trapezoidal shape in which one side line is inclined.

The plurality of signal lines 30 includes a first signal line 31 positioned at the first peripheral unit 210, a second signal line 32 positioned at the second peripheral unit 220, a third signal line 33 positioned at the third peripheral unit 230, and a fourth signal line 34 positioned at the fourth peripheral unit 240.

In such an embodiment, the first signal line 31 includes a first one side signal line 511 and a first other side signal line 512 separated or spaced apart from each other.

The first one side signal line 511 includes a first one side center line 511a positioned at the first main peripheral unit 210a, and a first one side connection line 511b connected to the first one side center line 511a and positioned at the first one end part 210b. The first one side center line 511a is connected to the display member 20.

The first other side signal line 512 includes a first other side center line 512a positioned at the first main peripheral unit 210a, and a first other side connection line 512b connected to the first other side center line 512a and positioned at the first other end part 210c. The first other side center line 512a is connected to the display member 20.

In such an embodiment, the second signal line 32 includes a second one side signal line 521 and a second other side signal line 522 separated or spaced apart from each other.

The second one side signal line 521 includes a second one side center line 521a positioned at the second main peripheral unit 220a and a second one side connection line 521b connected to the second one side center line 521a and positioned at the second one end part 220b. The second one side center line 521a is connected to the display member 20.

The second other side signal line 522 includes a second other side center line 522a positioned at the second main peripheral unit 220a and a second other side connection line 522b connected to the second other side center line 522a and positioned at the second other end part 220c. The second other side center line 522a is connected to the display member 20.

In such an embodiment, the third signal line 33 includes a third one side signal line 331 and a third other side signal line 332.

The third one side signal line 331 includes a third one side center line 331a and a third one side connection line 331b. The third one side center line 331a is connected to the first driving circuit unit 40 such that the driving signal generated from the first driving circuit unit 40 is transmitted to the third one side connection line 331b.

The third other side signal line 332 includes a third other side center line 332a and a third other side connection line 332b. The third other side center line 332a is connected to the first driving circuit unit 40 such that the driving signal generated from the first driving circuit unit 40 is transmitted to the third other side connection line 332b.

In such an embodiment, the fourth signal line 34 includes a fourth one side signal line 341 and a fourth other side signal line 342 separated or spaced apart from each other.

The fourth one side signal line 341 includes a fourth one side center line 341a positioned at the fourth main peripheral unit 240a and a fourth one side connection line 341b connected to the fourth one side center line 341a and positioned at the fourth one end part 240b. The fourth one side center line 341a is connected to a second driving circuit unit 50 such that the driving signal generated from the second driving circuit unit 50 is transmitted to the fourth one side connection line 341b.

The fourth other side signal line 342 includes a fourth other side center line 342a positioned at the fourth main peripheral unit 240a and a fourth other side connection line 342b connected to the fourth other side center line 342a and positioned at the fourth other end part 240c. The fourth other side center line 342a is connected to the second driving circuit unit 50 such that the driving signal generated from the second driving circuit unit 50 is transmitted to the fourth other side connection line 342b.

In such an embodiment, the fourth one end part 240b is bent to overlap the first other end part 210c. Accordingly, the first other side connection line 512b positioned at the first other end part 210c is in contact with the fourth one side connection line 341b positioned at the fourth one end part 240b to be connected thereto.

The fourth other end part 240c is bent to overlap the second other end part 220c. Accordingly, the second other side connection line 522b positioned at the second other end part 220c is in contact with the fourth other side connection line 342b positioned at the fourth other end part 240c to be connected thereto.

In such an embodiment, as described above, the first peripheral unit 210 including the first one end part 210b and the first other end part 210c and the second peripheral unit 220 including the second one end part 220b and the second other end part 220c are bent and the fourth peripheral unit 240 including the fourth one end part 240b and the fourth other end part 240c is bent, such that the fourth signal line 34 connected to the second driving circuit unit 50 may be connected to the first signal line 31 and the second signal line 32 connected to the display member 20 in the rear surface 100a of the display unit 100. Accordingly, the display unit 100 may be maximized by omitting the separate bezel area to transmit the driving signal of the second driving circuit unit 50.

In an alternative exemplary embodiment, as shown in FIGS. 1 to 6, at least one of the first one end part 210b, the second one end part 220b, the third one end part 230b and the third other end part 230c may have the trapezoidal shape in which only one side line is inclined. Alternative, as described above, at least one of the first one end part 210b, the second one end part 220b, the third one end part 230b, and the third other end part 230c may have a triangular shape.

Next, the display device according to another alternative exemplary embodiment will be described in detail with reference to FIGS. 12 to 14.

Figure 12:
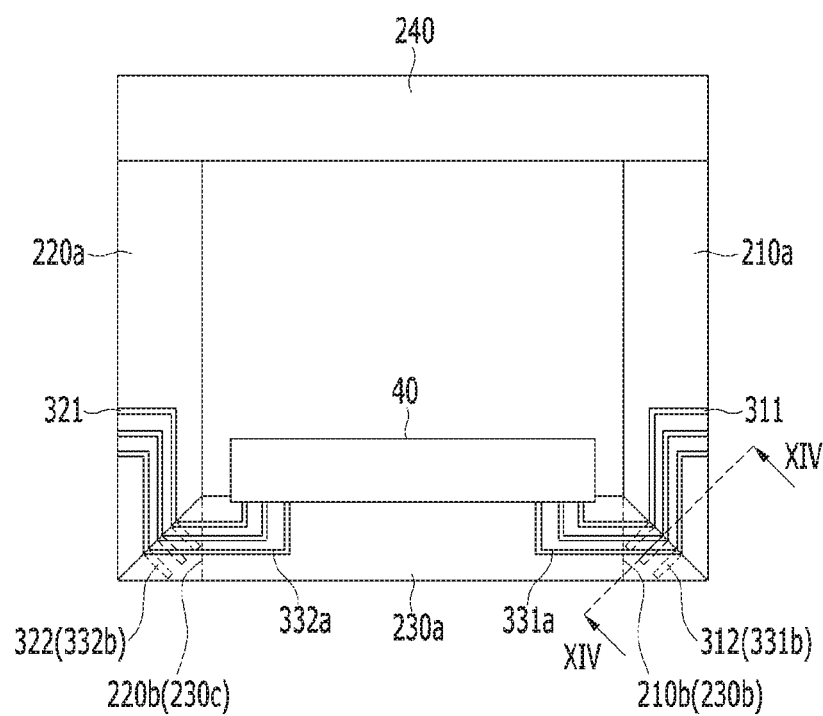
FIG. 12 is a rear view of a display device according to another alternative exemplary embodiment.
Figure 13:
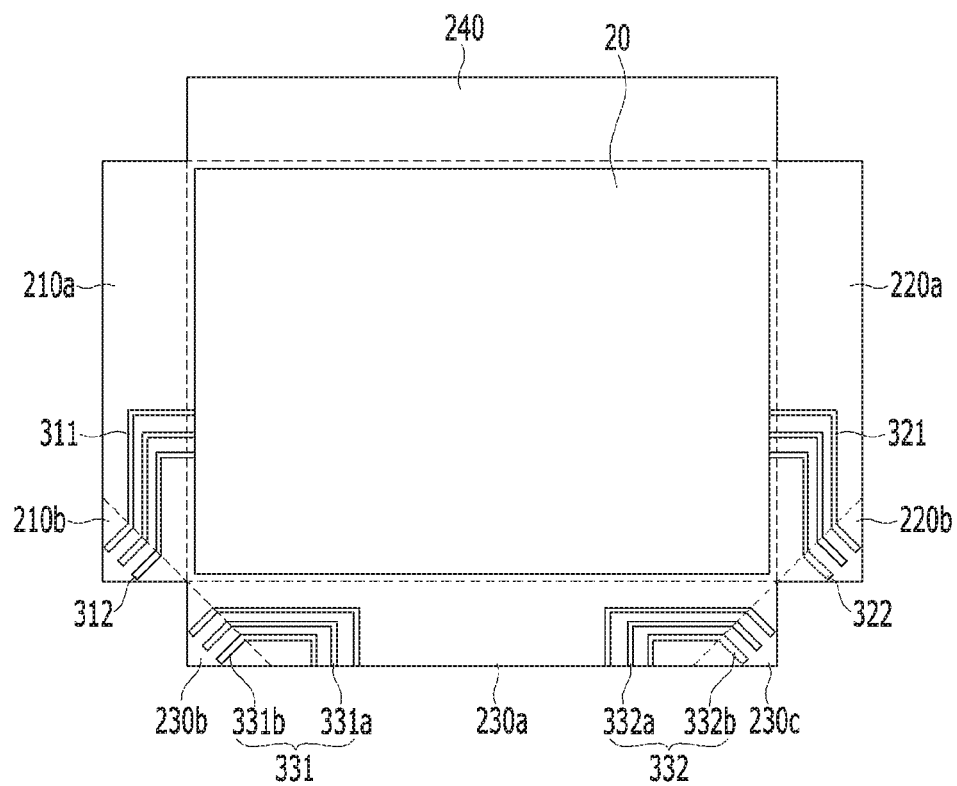
FIG. 13 is a top plan view showing the display device of FIG. 12 in a state in which a plurality of peripheral units is unbent.
Figure 14:
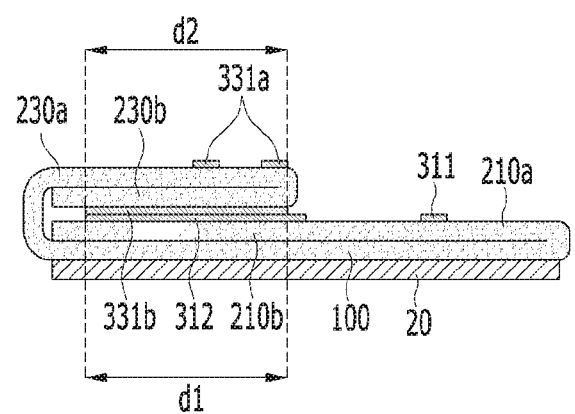
FIG. 14 is a cross-sectional view taken along line XIV-XIV of FIG. 12.

FIG. 12 is a rear view of a display device according to another alternative exemplary embodiment, FIG. 13 is a top plan view showing of the display device of FIG. 12 in a state in which a plurality of peripheral units is unbent, and FIG. 14 is a cross-sectional view taken along line XIV-XIV of FIG. 12.

The exemplary embodiment shown in FIGS. 12 to 14 is substantially the same as the exemplary embodiment shown in FIGS. 1 to 6 except for the structure of the first one end part, the second one end part, the third one end part, and the third other end part.

In an exemplary embodiment, as shown in FIGS. 12 to 14, the first main peripheral unit 210a and the second main peripheral unit 220a of the display device may have the trapezoidal shape in which only one side is inclined, the third main peripheral unit 230a may have the trapezoidal shape in which both side lines are inclined, and the fourth peripheral unit 240 may have a rectangular shape. In such an embodiment, each of the first one end part 210b, the second one end part 220b, the third one end part 230b and the third other end part 230c may have the triangular shape.

The third one end part 230b is bent to overlap the first one end part 210b. Accordingly, the first connection line 312 positioned at the first one end part 210b is in contact with the third one side connection line 331b positioned at the third one end part 230b to be connected thereto. In such an embodiment, where the first one end part 210b and the third one end part 230b have the triangular shape, the first one end part 210b and the third one end part 230b may be formed easier or more efficiently than the first one end part 210b and the third one end part 230b having the trapezoidal shape shown in FIGS. 1 to 6. In such an embodiment shown in FIGS. 1 to 6, the first one end part 210b and the third one end part 230b in the trapezoidal shape have a complicated shape, etching or patterning the pattern may not be effectively performed such that a failure probability may be high. In an exemplary embodiment shown in FIG. 13, the first one end part 210b and the third one end part 230b with the triangular shape have a non-complicated shape, such that etching or patterning the pattern may be effectively performed with lower failure probability.

In an exemplary embodiment, a length d1 of the first connection line 312 positioned at the first one end part 210b having the triangular shape and a length d2 of the third one side connection line 331b positioned at the third one end part 230b having the triangular shape may be longer than lengths of the first connection line 312 and the third one side connection line 331b positioned at the first one end part 210b and the third one end part 230b having the trapezoidal shape shown in FIGS. 1 to 6. Accordingly, in such an embodiment, a mutual contact area between the first connection line 312 and the third one side connection line 331b increases such that the contact failure may be minimized.

The third other end part 230c is bent to overlap the second one end part 220b. Accordingly, the second connection line 322 positioned at the second one end part 220b is in contact with the third other side connection line 332b positioned at the third other end part 230c to be connected thereto. In such an embodiment, where the second one end part 220b and the third other end part 230c have the triangular shape, the contact area between the second connection line 322 and the third other side connection line 332b increases, thereby minimizing the contact failure.

In an exemplary embodiment, as shown in FIGS. 10 and 11, each of the first one end part 210b, the first other end part 210c, the second one end part 220b, the second other end part 220c, the third one end part 230b, the third other end part 230c, the fourth one end part 240b and the fourth other end part 240c has the trapezoidal shape in which only one side line is inclined, but not being limited thereto. In an alternative exemplary embodiment, at least one of the first one end part 210b, the first other end part 210c, the second one end part 220b, the second other end part 220c, the third one end part 230b, the third other end part 230c, the fourth one end part 240b and the fourth other end part 240c may have the triangular shape.

Next, the display device according to another alternative exemplary embodiment will be described with reference to FIGS. 15 and 16.

Figure 15:
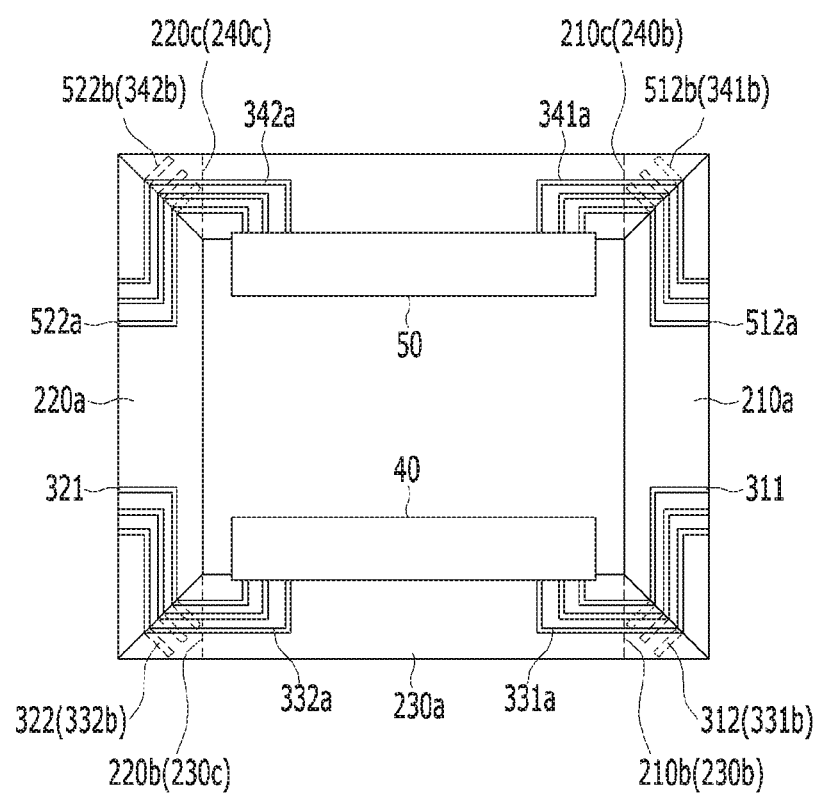
FIG. 15 is a rear view of a display device according to another alternative exemplary embodiment.
Figure 16:
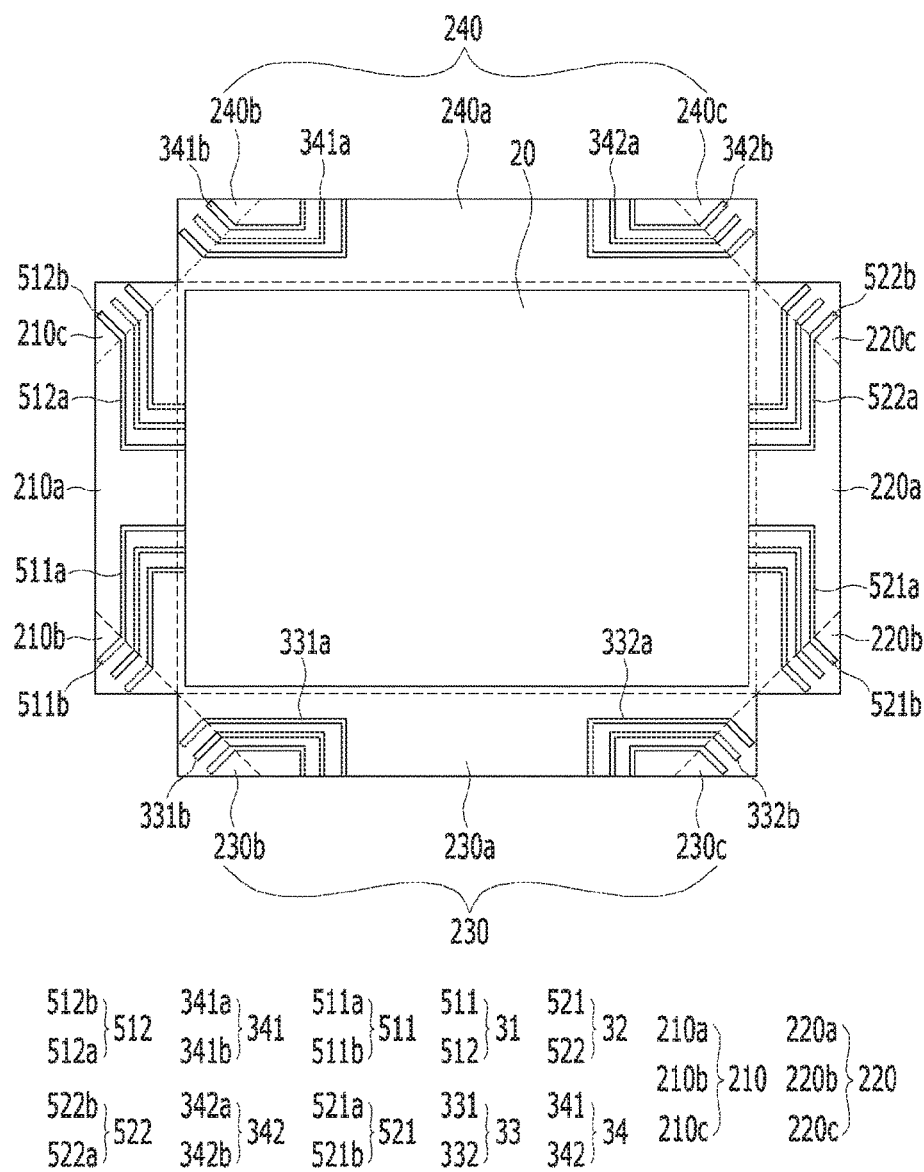
FIG. 16 is a top plan view showing the display device of FIG. 15 in a state in which a plurality of peripheral units is unbent.

FIG. 15 is a rear view of a display device according to another alternative exemplary embodiment, and FIG. 16 is a top plan view showing the display device of FIG. 15 in a state in which a plurality of peripheral units is unbent.

The exemplary embodiment shown in FIGS. 15 and 16 is substantially the same as the exemplary embodiment shown in FIGS. 10 and 11 except for the structure of the first one end part, the first other end part, the second one end part, the second other end part, the third one end part, the third other end part, the fourth one end part, and the fourth other end part.

As shown in FIGS. 15 and 16, each of the first main peripheral unit 210a, the second main peripheral unit 220a, the third main peripheral unit 230a, and the fourth main peripheral unit 240a of the display device may have the trapezoidal shape. In such an embodiment, as shown in FIGS. 15 and 16, each of the first one end part 210b, the first other end part 210c, the second one end part 220b, the second other end part 220c, the third one end part 230b, the third other end part 230c, the fourth one end part 240b, and the fourth other end part 240c may have the triangular shape.

The fourth one end part 240b is bent to overlap the first other end part 210c. Accordingly, the first other side connection line 512b positioned at the first other end part 210c is in contact with the fourth one side connection line 341b positioned at the fourth one end part 240b to be connected thereto. In such an embodiment, where the fourth one end part 240b and the first other end part 210c have the triangular shape, the contact area between the fourth one side connection line 341b and the first other side connection line 512b increases, thereby minimizing the contact failure.

The fourth other end part 240c is bent to overlap the second other end part 220c. Accordingly, the second other side connection line 522b positioned at the second other end part 220c is in contact with the fourth other side connection line 342b positioned at the fourth other end part 240c to be connected thereto. In such an embodiment, where the fourth other end part 240c and the second other end part 220c have the triangular shape, the contact area between the fourth other side connection line 342b and the second other side connection line 522b increases, thereby minimizing the contact failure.

In an alternative exemplary embodiment, at least one of the fourth peripheral unit may have the rectangle shape as shown in FIGS. 12 to 14, or, alternatively, at least one of the fourth peripheral unit may have the trapezoidal shape.

Next, the display device according to another alternative exemplary embodiment will be described in detail with reference to FIGS. 17 and 18.

Figure 17:
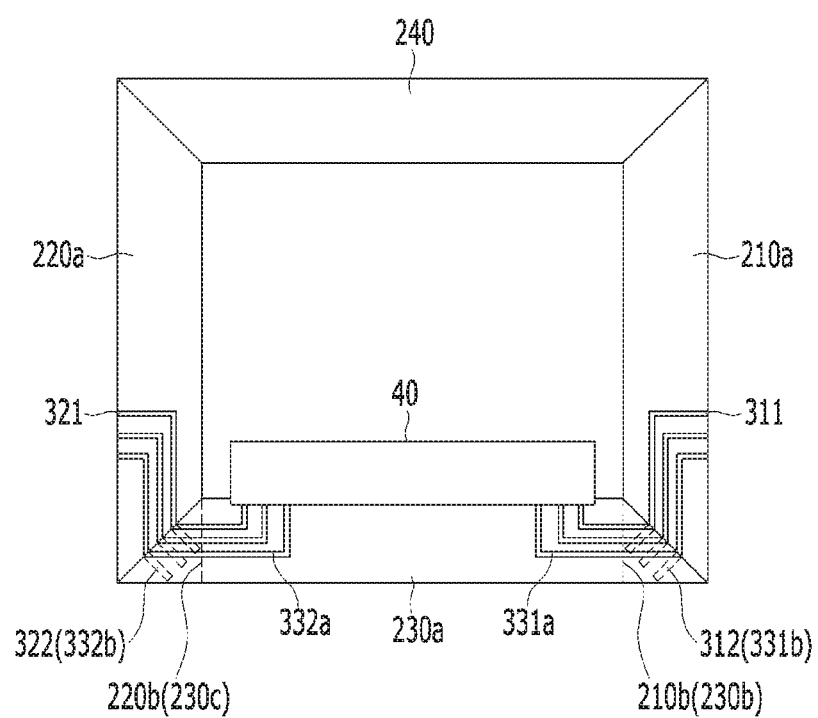
FIG. 17 is a rear view of a display device according to another alternative exemplary embodiment.
Figure 18:
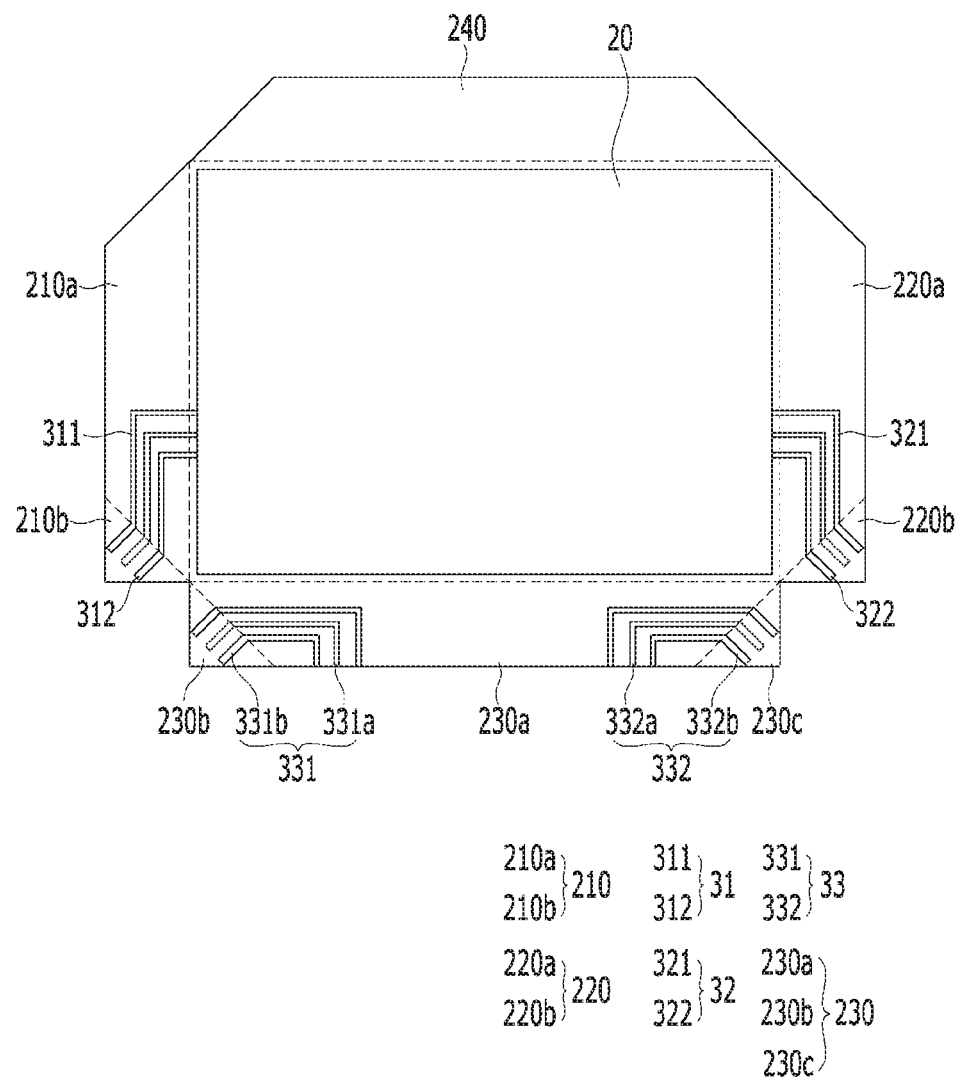
FIG. 18 is a top plan view showing the display device of FIG. 17 in a state in which a plurality of peripheral units is unbent.

FIG. 17 is a rear view of a display device according to another alternative exemplary embodiment, and FIG. 18 is a top plan view showing the display device in a state in which a plurality of peripheral units is unbent.

The exemplary embodiment shown in FIGS. 17 and 18 is substantially the same as the exemplary embodiment shown in FIGS. 12 to 14 except for the structure of the fourth peripheral unit such that the repeated description is omitted.

In an exemplary embodiment, as shown in FIGS. 17 and 18, each of the first main peripheral unit 210a, the second main peripheral unit 220a, the third main peripheral unit 230a, and the fourth peripheral unit 240 of the display device may have the trapezoidal shape in which both side lines may be inclined. In such an embodiment, each of the first one end part 210b, the second one end part 220b, the third one end part 230b, and the third other end part 230c to may have the triangular shape.

The first main peripheral unit 210a and the fourth peripheral unit 240 do not overlap each other, and the second main peripheral unit 220a and the fourth peripheral unit 240 also do not overlap each other.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a flexible substrate comprising a display unit and a plurality of peripheral units which surrounds the display unit and are bent to overlap a part of the display unit;
   a display member positioned at the display unit and which displays an image; and
   a signal line positioned at the plurality of peripheral units,
   wherein the plurality of peripheral units is bent in a way such that parts of the signal line, which are respectively positioned at adjacent peripheral units, are in contact with each other.

2. The display device of claim 1, wherein the plurality of peripheral units comprises:
   a first peripheral unit;
   a second peripheral unit opposite to the first peripheral unit; and
   a third peripheral unit positioned between the first peripheral unit and the second peripheral unit, and
   one end part of the first peripheral unit and one end part of the third peripheral unit overlap each other.

3. The display device of claim 2, wherein
   the third peripheral unit comprises the one end part, the other end part spaced apart from the one end part, and a third main peripheral unit between the one end part and the other end part,
   the one end part of the third peripheral unit is bent from the third main peripheral unit to overlap the one end part of the first peripheral unit,
   the plurality of signal lines comprises:
      a first signal line positioned at the one end part of the first peripheral unit,
      a second signal line positioned at one end part of the second peripheral unit; and
      a third one side signal line positioned at the one end part of the third peripheral unit, and
   the first signal line is in contact with the third one side signal line.

4. The display device of claim 3, wherein
   the one end part of the second peripheral unit and the other end part of the third peripheral unit overlap each other.

5. The display device of claim 4, wherein
   the other end part of the third peripheral unit is bent from the third main peripheral unit to overlap the one end part of the second peripheral unit,
   the plurality of signal lines further comprises a third other side signal line positioned at the other end part of the third peripheral unit, and
   the second signal line is in contact with the third other side signal line.

6. The display device of claim 4, wherein
   each of the one end part of the first peripheral unit, the one end part of the second peripheral unit, and the one end part and the other end part of the third peripheral unit has a trapezoidal shape.

7. The display device of claim 4, wherein
   each of the one end part of the first peripheral unit, the one end part of the second peripheral unit, and the one end part and the other end part of the third peripheral unit has a triangular shape.

8. The display device of claim 7, wherein
   the plurality of peripheral units further comprises a fourth peripheral unit opposite to the third peripheral unit, and
   the first peripheral unit and the fourth peripheral unit do not overlap each other.

9. The display device of claim 2, wherein
   the plurality of peripheral units further includes a fourth peripheral unit opposite to the third peripheral unit,
   the other end part of the first peripheral unit and one end part of the fourth peripheral unit overlap each other, and the other end part of the second peripheral unit and the other end part of the fourth peripheral unit overlap each other.

10. The display device of claim 9, wherein the fourth peripheral unit comprises the one end part, the other end part spaced apart from the one end part and a fourth main peripheral unit positioned between the one end part and the other end part, the other end part of the fourth peripheral unit is bent from the fourth main peripheral unit to overlap the other end part of the first peripheral unit, the plurality of signal lines comprises:
- a first other side signal line positioned at the other end part of the first peripheral unit;
- a second other side signal line positioned at the other end part of the second peripheral unit;
- a fourth one side signal line positioned at the one end part of the fourth peripheral unit; and
- a fourth other side signal line positioned at the other end part of the fourth peripheral unit, and the first other side signal line is in contact with the fourth one side signal line, and the second other side signal line is in contact with the fourth other side signal line.

11. The display device of claim 10, wherein each of one end part and the other end part of the first peripheral unit, each of one end part and the other end part of the second peripheral unit, each of one end part and the other end part of the third peripheral unit, and each of one end part and the other end part of the fourth peripheral unit have a trapezoidal shape.

12. The display device of claim 10, wherein each of one end part and the other end part of the first peripheral unit, each of one end part and the other end part of the second peripheral unit, each of one end part and the other end part of the third peripheral unit, and each of one end part and the other end part of the fourth peripheral unit have a triangular shape.

* * * * *